(12) United States Patent
Okuyama et al.

(10) Patent No.: US 6,429,032 B1
(45) Date of Patent: Aug. 6, 2002

(54) NITRIDE SEMICONDUCTOR AND A METHOD THEREOF, A NITRIDE SEMICONDUCTOR DEVICE AND A METHOD THEREOF

(75) Inventors: Hiroyuki Okuyama; Hiroshi Nakajima; Fumihiko Nakamura, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/481,122

(22) Filed: Jan. 11, 2000

(30) Foreign Application Priority Data

Jan. 12, 1999 (JP) .......................................... 11-005590

(51) Int. Cl.$^7$ ............................................. H01L 21/60
(52) U.S. Cl. .............................. 438/22; 438/46; 438/47
(58) Field of Search ............................... 438/22, 46, 47, 438/32, 702; 216/101, 19, 37, 64; 257/94, 102, 103, 745

(56) References Cited

U.S. PATENT DOCUMENTS

| | | | | |
|---|---|---|---|---|
| 5,005,057 A | * | 4/1991 | Izumiya et al. | 357/17 |
| 5,693,963 A | * | 12/1997 | Fujimoto et al. | 257/94 |
| 5,814,239 A | * | 9/1998 | Kaneko et al. | 216/63 |
| 6,104,039 A | * | 8/2000 | Asatsuma et al. | 257/22 |
| 6,194,743 B1 | * | 2/2001 | Kondoh et al. | 257/94 |

OTHER PUBLICATIONS

Lai et al, "InGaN–AlInGaN Multiquantum–Well LED's", Jun. 2001, IEEE Photonics Technology Letters, vol. 13, No. 6, pp. 559–561.*

Karmalkar et al, "Enhancement of Breakdown Voltage in AlGaN/GaN High Electron Mobility Transistors Using a Field Plate" Aug. 2001, IEEE Transactions on Electron Devices, vol. 48 No. 8, pp. 1515–1521.*

Osinski et al, "Design of InGaN–GaN–AlGaN VerticalCavity Surface–Emitting Lasers Using Electrical–Thermal–Optical Simulation" Mar./Apr. 2001, IEEE Journal on Selected Topics in Quantum Electronics, vol. 7. No. 2, pp. 270–279.*

* cited by examiner

Primary Examiner—John F. Niebling
Assistant Examiner—Walter L. Lindsay, Jr.
(74) Attorney, Agent, or Firm—Sonnenschein, Nath & Rosenthal

(57) ABSTRACT

In a nitride semiconductor of $B_pAl_qGa_rIn_sN$ ($0 \leq p \leq 1$, $0 \leq q \leq 1$, $0 \leq r \leq 1$, $0 \leq s \leq 1$, $p+q+r+s=1$), in particular a p-type nitride compound semiconductor, a point defect concentration of the p-type semiconductors is set to $1 \times 10^{19}$ cm$^{-3}$ or more. This makes it possible to obtain a high carrier concentration at room temperature.

21 Claims, 5 Drawing Sheets

NITRIDE SEMICONDUCTOR AND A METHOD THEREOF, A NITRIDE SEMICONDUCTOR DEVICE AND A METHOD THEREOF

BACKGROUND OF THE INVENTION

1. Field of the Invention

The present invention relates particularly to a nitride semiconductor represented by $B_pAl_qGa_rIn_sN$ ($0 \leq p \leq 1$, $0 \leq q \leq 1$, $0 \leq r \leq 1$, $0 \leq s \leq 1$, $p+q+r+s=1$), a nitride semiconductor luminescence device, a method for producing a nitride semiconductor, and a method for producing a semiconductor luminescence device.

2. Description of the Related Art

As a conventional method for obtaining a p-type semiconductor of a gallium nitride based compound, there is generally known a method of using a magnesium organic metal as a raw material of a p-type dopant.

It is know that magnesium, Mg, makes it possible to produce the sallowest acceptor level among p-type impurities that have been known up to now.

However, in the case that hydrogen is contained in a carrier gas for raw materials in gaseous growth, a phenomenon occurs that an acceptor of Mg becomes inactive in gallium nitride based crystal. By annealing the film of this inactive gallium nitride at about 700–900° C. in an inert gas, the carrier concentration can be measured, and it is known that the resultant becomes a p-type (S. Nakamura et al., Japan Journal of Applied Physics, 30, (10A) L1708–L1711 (1991)).

The level of Mg impurity is so deep as about 200 mev. Thus, even if all of the Mg atoms become acceptors, the carrier concentration at room temperature becomes lower by about 2 figures than it.

SUMMARY OF THE INVENTION

As described above, in gallium nitride based compound semiconductors, in particular, p-type gallium nitride based compound semiconductors, the carrier concentration at room temperature comes into question. In order to improve the concentration of the carriers at room temperature, the impurity level thereof needs to be sallow.

The present invention has been made to solve this problem.

According to the present invention, there is provided a nitride semiconductor of p-type $B_pAl_qGa_rIn_sN$ ($0 \leq p \leq 1$, $0 \leq q \leq 1$, $0 \leq r \leq 1$, $0 \leq s \leq 1$, $p+q+r+s=1$), having a point defect concentration of $1 \times 10^{19}$ cm$^{-3}$ or more, thereby making it possible to obtain a high carrier concentration.

According to the present invention, there is provided a nitride semiconductor luminescence device comprising nitride semiconductor layers made of p-type $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein at least one of the p-type nitride semiconductor layers has a point defect concentration of $1 \times 10^{19}$ cm$^{-3}$ or more, thereby making it possible to obtain a high carrier concentration.

According to the present invention, there is provided a method for producing a p-type nitride semiconductor of $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein the p-type nitride semiconductor having a point defect concentration of $1 \times 10^{19}$ cm$^{-3}$ or more is grown.

According to the present invention, there is provided a method for producing a p-type nitride semiconductor of $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein the supplying ratio V/III of a V group raw material to a III group raw material is set to 1000–5000 to grow the p-type nitride semiconductor.

According to the present invention, there is provided a method for producing a p-type nitride semiconductor of $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein the p-type nitride semiconductor is grown at a growing rate of 4 μm/hour or more.

The method for producing a nitride semiconductor of the present invention can be based on any combination of the above-mentioned various methods for producing the nitride semiconductor.

According to the present invention, there is provided a method for producing a nitride semiconductor luminescence device comprising p-type nitride semiconductor layers made of $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein at least one of the p-type nitride semiconductor layers is grown as a p-type nitride semiconductor having a point defect concentration of $1 \times 10^{19}$ cm$^{-3}$ or more.

According to the present invention, there is provided a method for producing a nitride semiconductor luminescence device comprising p-type nitride semiconductor layers made of $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein at least one of the p-type nitride semiconductor layers is grown in the manner that the supplying ratio V/III of a V group raw material to a III group raw material is set to 1000–5000.

According to the present invention, there is provided a method for producing a nitride semiconductor luminescence device comprising p-type nitride semiconductor layers made of $B_pAl_qGa_rIn_sN$ ($0 \leq p \leq 1$, $0 \leq q \leq 1$, $0 \leq r \leq 1$, $0 \leq s \leq 1$, $p+q+r+s=1$), wherein at least one of the p-type nitride semiconductors is grown at a growing rate of 4 μm/hour or more.

The method for producing a nitride semiconductor luminescence device of the present invention can be based on any combination of the above-mentioned various methods for producing the nitride semiconductor luminescence device.

It has been proved that in the above-mentioned nitride semiconductor or the above-mentioned nitride semiconductor luminescence device of the present invention, the p-type $B_pAl_qGa_rIn_sN$ ($0 \leq p \leq 1$, $0 \leq q \leq 1$, $0 \leq r \leq 1$, $0 \leq s \leq 1$, $p+q+r+s=1$) has a high carrier concentration at room temperature. This is based on the fact that the acceptor level of dopant Mg becomes shallow or a new shallow level is generated. This fact has been made clear by temperature variable hole measurement.

DETAILED DESCRIPTION OF THE PREFERRED EMBODIMENT

According to the nitride semiconductor of the present invention, on a substrate made of for example, sapphire, SiC, ZnO, Si, GaAs, spinel, GaN or the like, p-type $B_pAl_qGa_rIn_sN$ ($0 \leq p \leq 1$, $0 \leq q \leq 1$, $0 \leq r \leq 1$, $0 \leq s \leq 1$, $p+q+r+s=1$) having a point defect concentration of $1 \times 10^{19}$ cm$^{-3}$ or more is formed.

Figure 1:
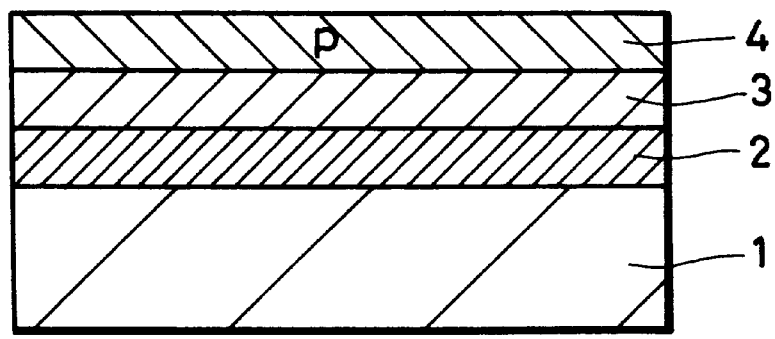
FIG. 1 is a schematic sectional view of an embodiment of the semiconductor of the present invention.

An embodiment of the nitride semiconductor of the present invention will be described. FIG. 1 is a schematic sectional view of this embodiment.

In FIG. 1, p-type $B_pAl_qGa_rIn_sN$ ($0 \leq p \leq 1$, $0 \leq q \leq 1$, $0 \leq r \leq 1$, $0 \leq s \leq 1$, $p+q+r+s=1$) doped with Mg is formed over a sapphire substrate 1 on which a buffer layer 2 made of GaN and an undoped layer 3 made of GaN are formed.

An example of the method according to the present invention for producing this nitride semiconductor will be described.

For example, the sapphire substrate 1 of a C plane is first prepared, and then is heated to 1050° C. to perform so-called thermal cleaning.

Thereafter, growing temperature is set to about 500° C. to grow the buffer layer 2 of GaN epitaxially.

Subsequently, the temperature of the substrate 1 is raised to about 1000° C., so as to grow the undoped layer 3 of GaN until it has a thickness of about 1 μm.

A p-type nitride semiconductor 4 made of GaN to which Mg is added (GaN:Mg) is epitaxially grown on this undoped GaN layer 3.

The epitaxial growth of the respective GaN layers 2–4 is performed by MOCVD (Metal Organic Chemical Vapor Deposition).

Hydrogen is used as a carrier gas. Thereafter, the carrier concentration of the semiconductor 4 can be raised by annealing.

TMGa (trimethylgallium: (CH3)$_3$Ga) is used as a raw material for Ga, and NH$_3$ is used as a raw material for nitrogen (N). (MeCp)$_2$Mg (bis-methylcyclopentadienylmagnesium) is used as a raw material for Mg.

A sample on which a film of the nitride semiconductor 4 of GaN:Mg is formed is produced by setting growing temperature to 990° C., fixing the flow rate or supply rate of NH3 gas as a V group raw material to 15 [slm], changing the flow rate of TMGa gas from 39.6 to 158 [μmol/min.], and changing the flow rate amount of (MeCp)$_2$Mg from 0.35 to 1.38 [μmol/min.].

Figure 4:
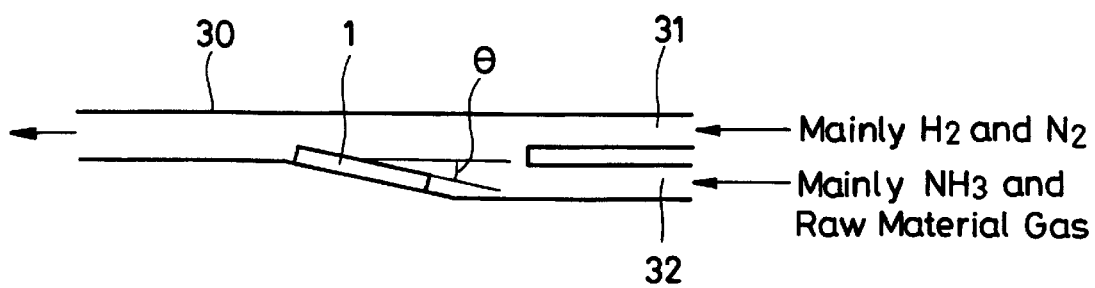
FIG. 4 is a schematic sectional view of a device used in the formation of a semiconductor film according to the present invention.

As shown in FIG. 4, when the film of this nitride semiconductor 4 is to be formed the substrate 1 is arranged, for example, at an angle θ to the horizontal direction inside a reaction tube 30. The raw material gases and the carrier gas are then supplied in the horizontal direction through supplying openings 31 and 32 of the respective raw material gases. In this way, these gases are supplied at the given angle θ (in particular, $0° \leq \theta \leq 45°$) to the surface of the substrate 1 for the deposition surface of the semiconductor 4.

Figure 5:
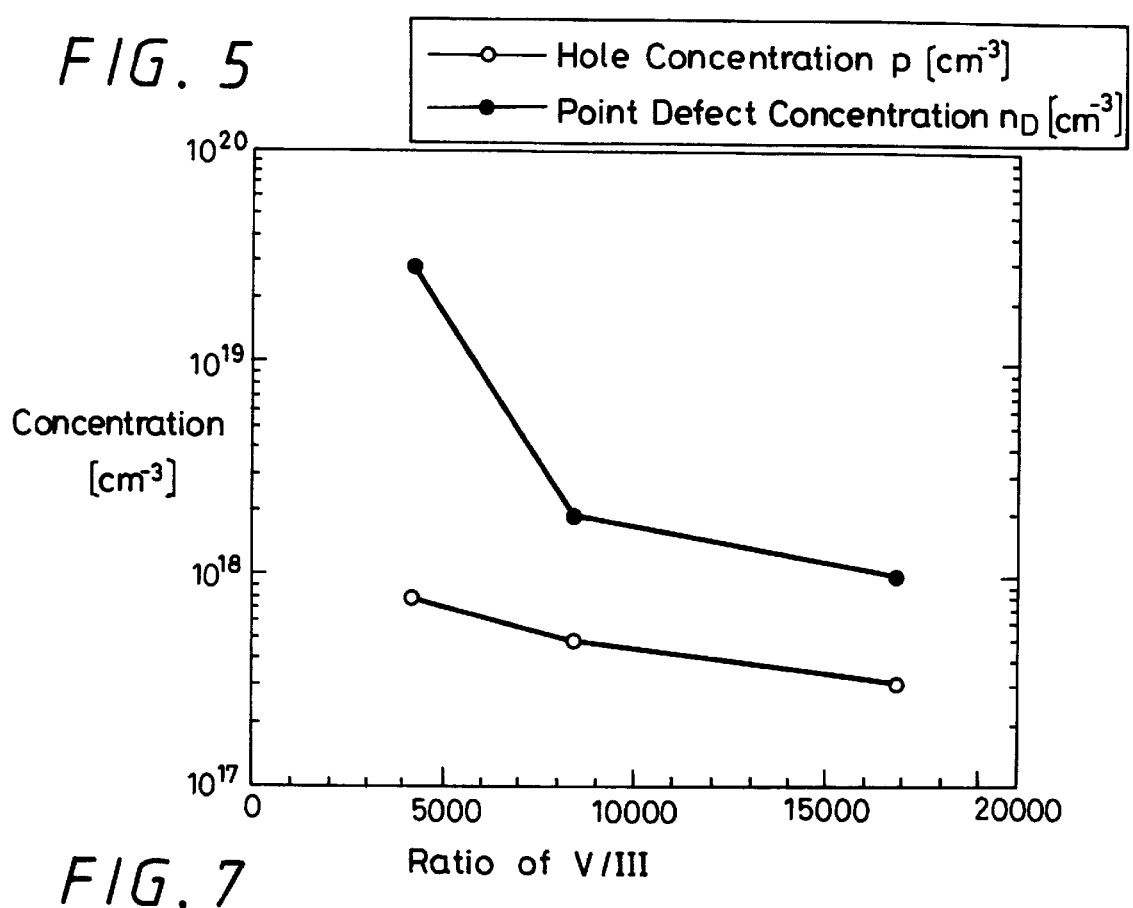
FIG. 5 is a view showing results of measurements of dependency of p-type carrier concentration and point defect concentration upon the ratio of V/III.

FIG. 5 is a view showing measured results of p-type carrier concentration (plotted by black circle in FIG. 5) and point defect concentration (plotted by white circle in FIG. 5) in the semiconductors 4 on which a film has been formed by changing the above-mentioned ratio of V/III. In this document, we estimated the point defect density by using both the intensity of the band-edge emission using photoluminescence method and the hole density at room temperature, which have been found as the result of devoted study.) It was found according to these results that the p-type carrier concentration can be changed by the ratio of V/III and the carrier concentration becomes maximum in the case that the ratio of V/III is 5000 or less.

Thus, in order to obtain a high p-type carrier concentration, the supplying ratio of V/III is set to 5000 or less. However, if the supplying ratio of V/III is less than 1000, the growing rate is too fast, resulting in that an industrial problem will happen and optical properties are also lowered. Therefore, the ratio of V/III is set to 1000–5000.

Figure 6:
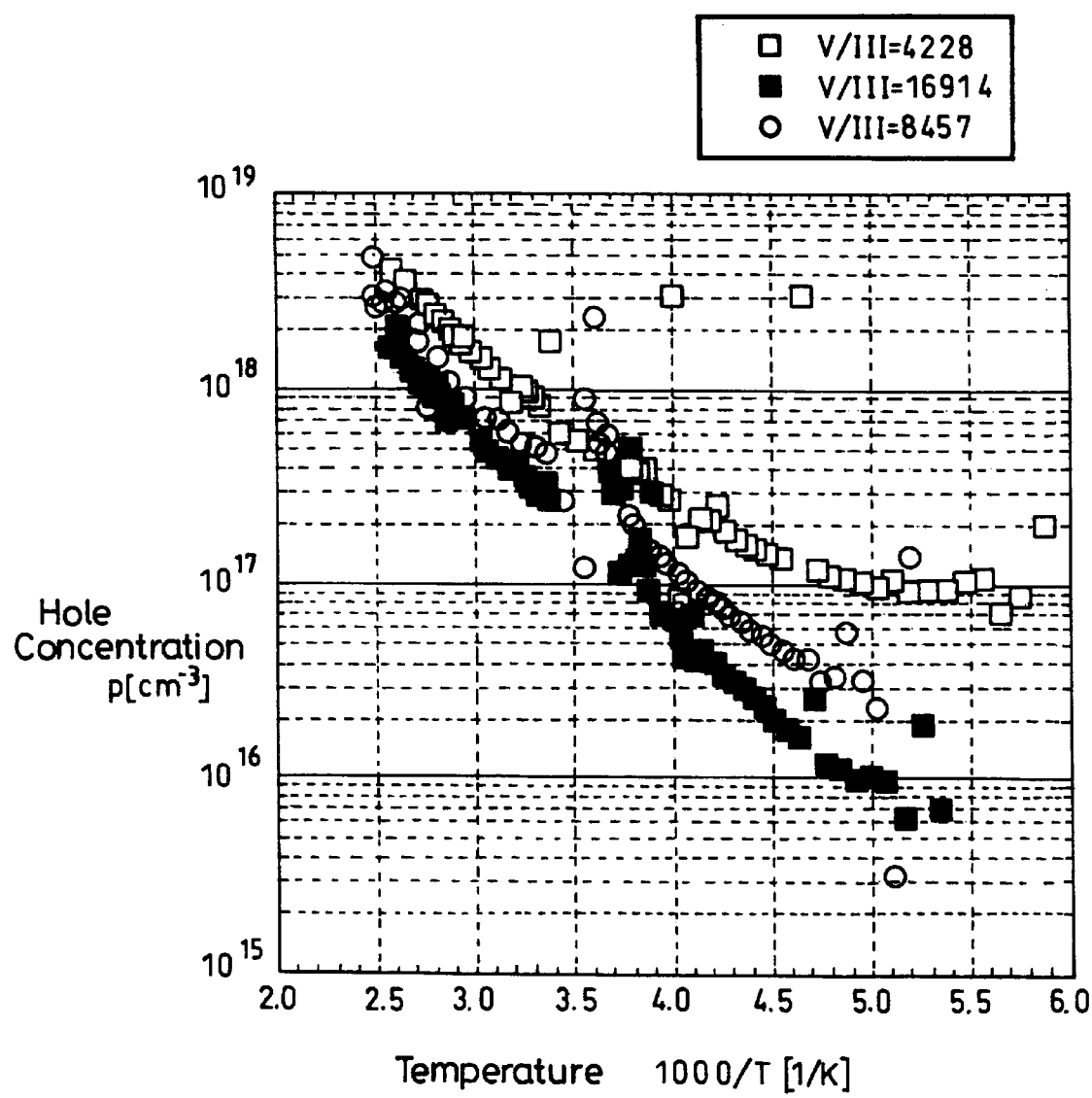
FIG. 6 is a view showing results of measurements of dependency of hole concentration upon the ratio of V/III, as a parameter.

Acceptor concentration-donor concentration $N_A-N_D$ of samples, on which the above-mentioned supplying ratio of V/III were measured by measuring capacitance-voltage (C-V) thereof, and it resulted in that $N_A-N_D$ were substantially the same. It was found from this result that the difference in hole concentration can be generated by the difference in activating energy. The hole concentration was measured to obtain results shown in FIG. 6. In FIG. 6, □, ■ and ○ represent results in the cases of V/III=4228, V/III=16914 and V/III=8457, respectively. The acceptor levels to the supplying ratios of V/III were obtained under the same assumption to get the results shown in FIG. 7.

Figure 7:
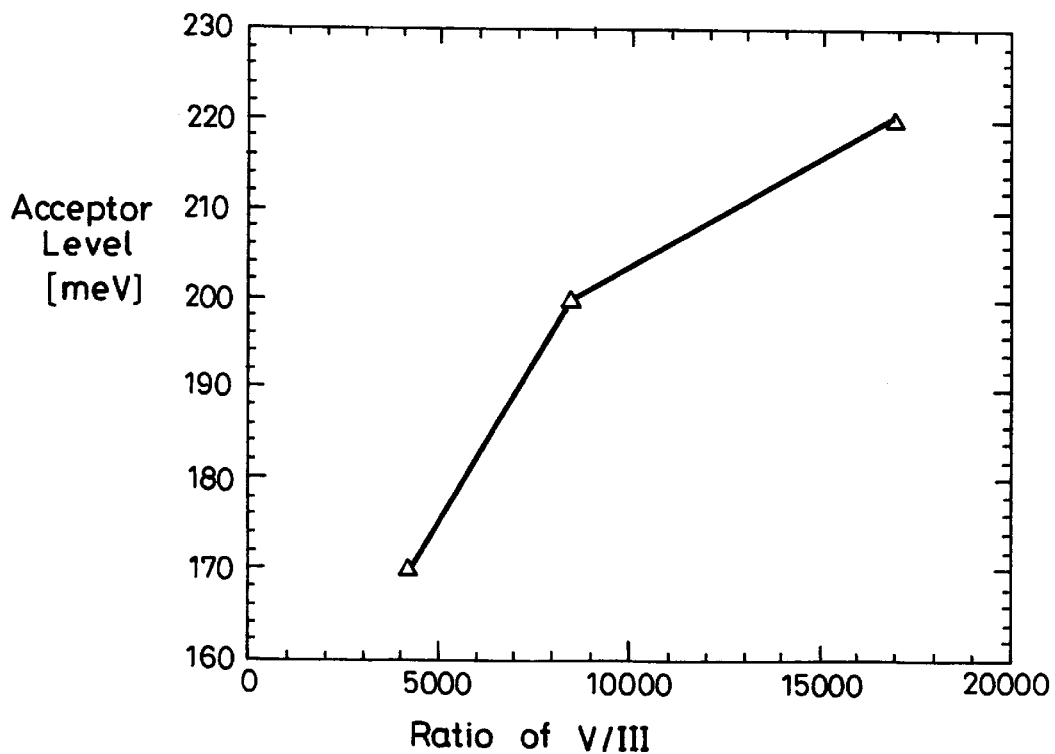
FIG. 7 is a view showing the dependency of acceptor level upon the ratio of V/III.

It is clear from comparison of FIG. 5 with FIG. 7 that the acceptor level and the point defect concentration have a correlation and the acceptor level becomes sallower and the hole concentration becomes higher as the point defect concentration becomes larger. It can also be understood that the point defect concentration needs to be set to $1 \times 10^{19}$ cm$^{-3}$ or more. This is a reason why the point defect concentration is set to $1 \times 10^{19}$ cm$^{-3}$ or more in the present invention. Since the upper limit of these point defect concentrations is as high as the concentration of the parent body, the point defect concentration is set within the range of $1 \times 10^{19}$ cm$^{-3}$ to $1 \times 10^{22}$ cm$^{-3}$.

As shown in FIGS. 5 and 7, as the ratio of V/III becomes lower, an acceptor level having an extremely low activating energy makes its appearance so that the carrier concentration is rising. This phenomenon can be considered as follows.

It is known that if the supplying rate of a V group raw material is short in an initial crystal growth period, a crystal having a good quality cannot be grown. By reducing the V group atom relatively, point defects are generated in the grown film by a drop in crystallinity. On the other hand, point defects generally compensate carriers. However, it can be considered that in the case that Mg is introduced, a complex is formed to make a semiconductor having a shallow acceptor level. In this case, there are generated defects having substantially the same concentration as the acceptor concentration so as to have an influence on the carrier concentration. Therefore, it appears that point defect concentrations of $1 \times 10^{19}$ cm$^{-3}$ or more can exert an influence on the carrier concentration to make a shallow level and to raise the carrier concentration.

Figure 8:
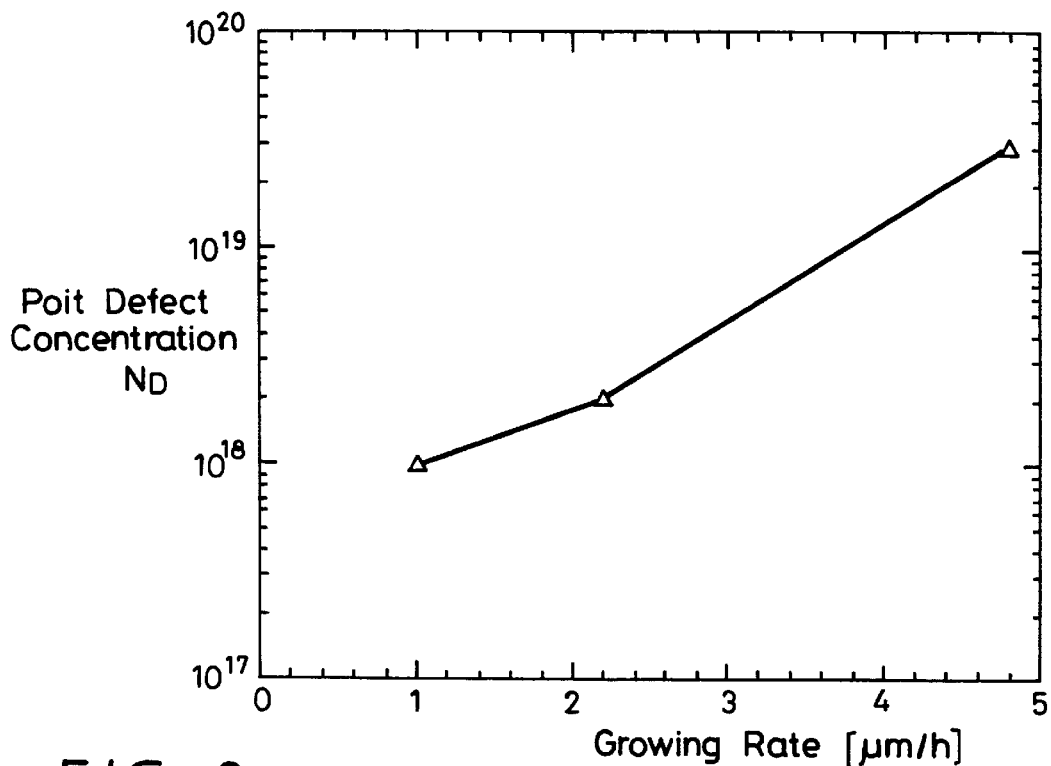
FIG. 8 is a view showing the relationship between measured growing rate and point defect concentration.

If the relationship between the above-mentioned study and crystal growth is considered, the following would be found. By increasing the amount of the III group atom to promote the growth from the III group atom or the growing rate therefrom, defects are easily introduced. FIG. 8 is a view showing the relationship between the measured growing rate ($\mu$m/hour) and point defect concentration nD. It can be understood from this relationship that the point defect concentration can be raised by raising the growing rate. In order to make the point defect concentration $1\times10^{19}$ cm$^{-3}$ or more, the growing rate GR is set to 4 $\mu$m/hour or more.

However, if the growing rate becomes too high, a high-quality crystal cannot be obtained by the MOCVD. Therefore, this growing rate is set to 4–10 $\mu$m/hour.

Figure 2:
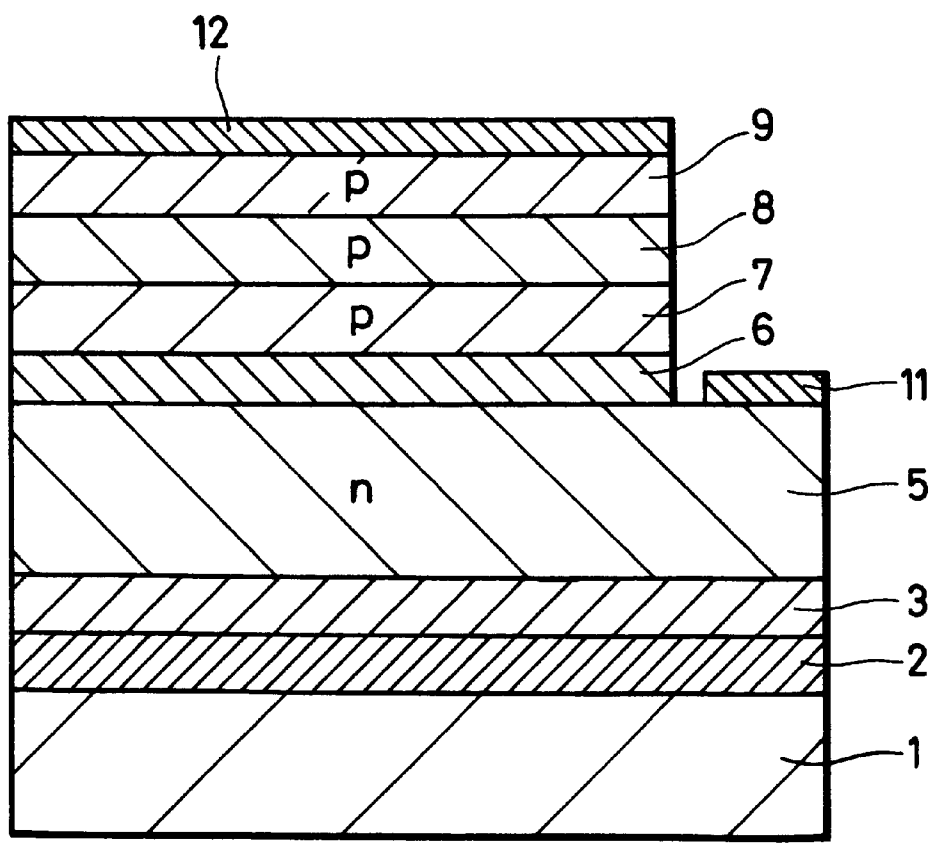
FIG. 2 is a schematic sectional view of an embodiment of the semiconductor device of the present invention.

The following will describe an embodiment of the nitride semiconductor luminescence device according to the present invention. This embodiment is an example of a light emitting diode LED. FIG. 2 is a schematic sectional view of this embodiment.

This light emitting diode has a structure wherein on a substrate 1, a buffer layer 2, an undoped layer 3, an n-type cladding layer 5, an active layer 6, a first p-type cladding layer 7, a second p-type cladding layer 8 and a contact layer 9 are successively stacked.

In this embodiment, the contact layer 9 has the same structure as the nitride semiconductor 4 in FIG. 1 and is made as a layer having a high p-type carrier concentration.

The following will describe an embodiment of the method according to the present invention for producing the semiconductor luminescence device of the present invention.

In the same way as described about the embodiment shown in FIG. 1, in this embodiment, the substrate 1 made of, for example, sapphire of a C plane is first prepared, and then this is heated to 1050° C. to perform so-called thermal cleaning.

Thereafter, growing temperature is set to about 500° C. to grow the buffer layer 2 of GaN epitaxially.

Subsequently, the temperature of the substrate 1 is raised to about 1000° C., so as to grow the undoped layer 3 of GaN until it has a thickness of about 1 $\mu$m.

The n-type cladding layer 5 made of GaN:Si to which n-type impurity Si is added is epitaxially grown on the GaN undoped layer 3 to have a thickness of, for example, 3 $\mu$m. The active layer 6 having a multi quantum well structure is epitaxially grown thereon by stacking an InGaN layer and a GaN layer repeatedly. At this time, the proportion of In (x in InxGa1-xN) varies in accordance with luminous wavelengths but is set to the range of x=about 0.01 to about 0.4.

The first p-type cladding layer 7 made of Al$_{0.15}$Ga$_{0.85}$N:Mg to which p-type impurity Mg is added is epitaxially grown on the active layer 6. Furthermore, the second p-type cladding layer 8 made of GaN:Mg is epitaxially grown thereon. The contact layer 9 made of GaN:Mg is epitaxially grown on the second cladding layer 8.

The epitaxial growth of the respective nitride semiconductor layers 5–9 is performed by MOCVD. Raw martial gases thereof may be the same as in the above-mentioned embodiment. TMGa may be used as a raw material for Ga, and NH3 may be used as a raw material for nitrogen (N). (MeCp)$_2$Mg (bis-methylcyclopentadienylmagnesium) may be used as a raw material for Mg. SiH$_4$ may be used as a raw material for Si, and TMIn (trimethylindium) and TMAl (trimethylaluminium) may be used as raw materials for In and Al.

The nitride semiconductor layers 5–8 are deposited by MOCVD at a relatively low temperature of about 600–800° C., and the contact layer 9 is deposited at a raised temperature up to 1000° C. in the state that Mg concentration is also raised.

As described about the embodiment shown in FIG. 1, this contact layer 9 is grown by setting the ratio of V/III, the growing rate and the point defect density nD to 1000–5000, 4–10 $\mu$m/hour, and $1\times10^{19}$–$1\times10^{22}$ cm$^{-3}$, respectively.

After this deposition, the resultant is anealed to activate the p-type carrier.

A groove is made to penetrate the contact layer 9, the cladding layers 8 and 7, and the active layer 6 to leave a stripe portion, by which an electric current is supplied to the operation portion of the semiconductor layer, that is, the active layer. The groove is made outside the stripe portion, to expose a portion of the cladding layer 5 outside. A first electrode 11 is in ohmic contact therewith.

The first ohmic electrode 11 is in ohmic contact onto the cladding layer 5 by depositing (such as vapor-depositing or sputtering) respective metal layers made of, for example, Ti, Al, Pt and Au successively. A second electrode 12 is in ohmic contact onto the contact layer 9 by depositing (such as vapor-depositing or sputtering) respective metal layers made of, for example, Ni, Pt and Au successively.

The nitride semiconductor luminescence device having this structure emits light based on electroluminescence by supplying an electric current in normal direction between the first and second electrode 11 and 12.

According to this structure, the resistance of the contact layer 9 can be made sufficiently small to reduce the resistance in normal direction. Thus, a high efficiency for emitting light can be obtained by low-voltage driving.

As described above, at the time of depositing the p-type contact layer 9 in the semiconductor luminescence device of the present invention, the supplying ratio of V/III is set to 1000–5000. Desirably, at the time of depositing the first and second cladding layers 6 and 7 near the luminescence operating portion, that is, the active layer 6, the supplying ratio of V/III is set to 10000 or more.

Figure 9:
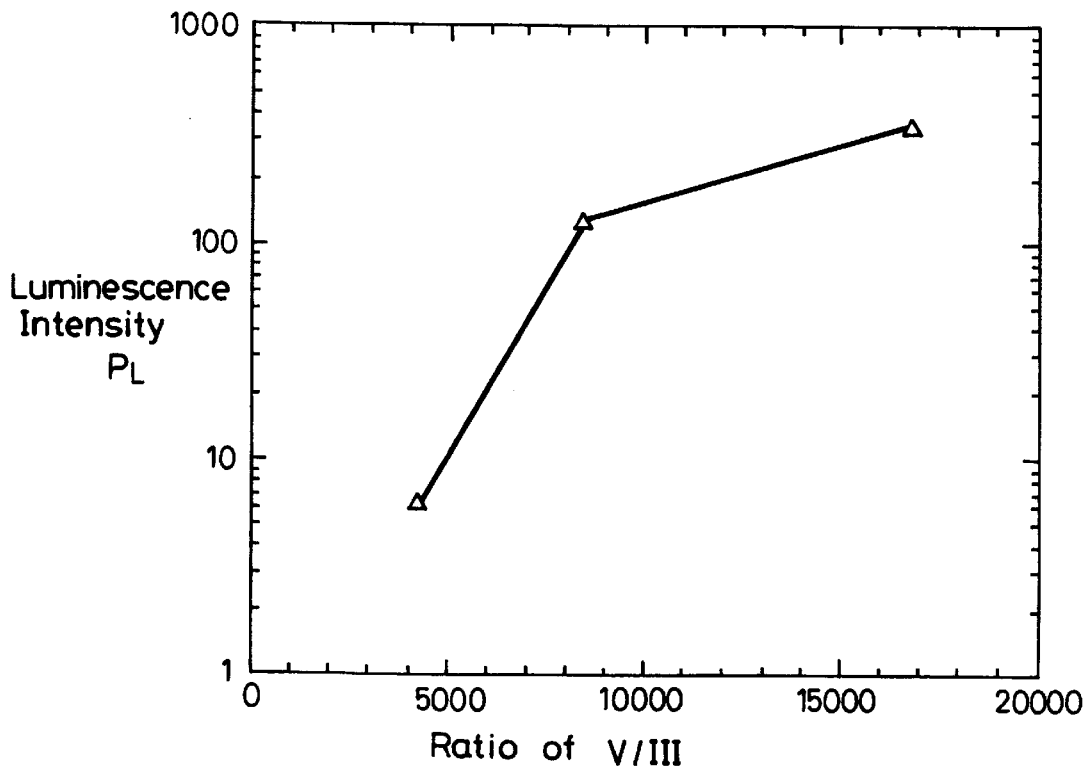
FIG. 9 is a view showing the dependency of luminescence intensity upon the ratio of V/III.

That is, FIG. 9 shows the relationship between the supplying ratio of V/III and measured luminescence intensity. In this case, the luminescence intensity becomes lower as the supplying ratio of V/III becomes smaller. In other words, an increase in point defects causes a drop in luminescence intensity, that is, optical property, but in the nitride semiconductor luminescence device of the present invention its series resistance can be reduced without lowering luminescence intensity by causing many point defects to generate only in the contact layer 9.

Figure 3:
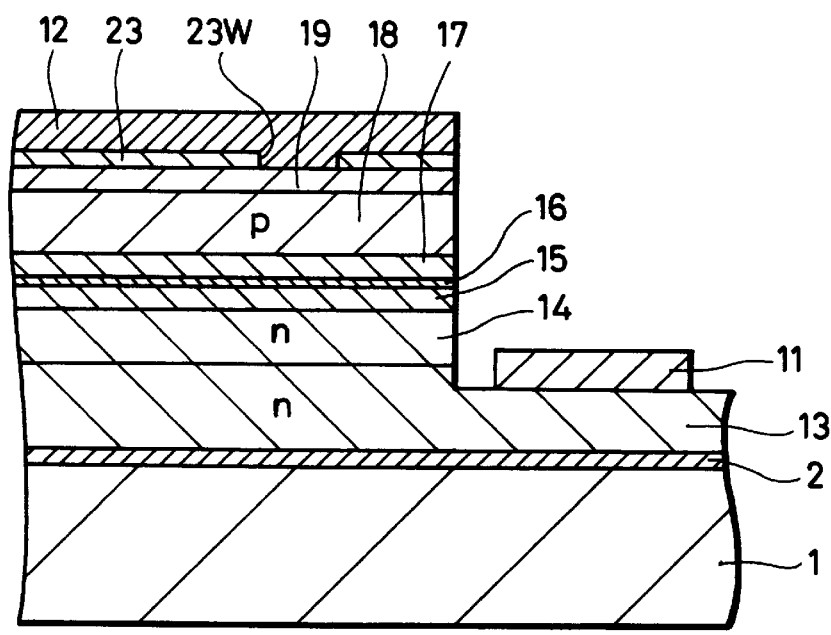
FIG. 3 is a schematic sectional view of another embodiment of the semiconductor device of the present invention.

The embodiment of the nitride semiconductor luminescence device of the present invention relates to a light emitting diode. A semiconductor laser can be however made by the present invention. FIG. 3 is a schematic sectional view of an embodiment thereof. This embodiment is a semiconductor laser having an SCH-MQW (Separate Confinement Heterostructure-Multi Quantum Well) structure.

This semiconductor laser will be described together with an example of the producing method of the present invention. In this example, for example, a substrate 1 of sapphire is prepared.

For example, the GaN buffer layer 2 is epitaxially grown on this substrate 1 at a low substrate temperature of, for example, 500° C., to have a thickness of 50 nm. Subsequently, the substrate temperature is raised to 1000° C. and the first n-type contact layer 13 made of GaN and doped with silicon (Si) is formed to have a thickness of 5 $\mu$m. The following are epitaxially grown thereon one by one: the n-type cladding layer 14 made of AlGaN:Si and having a thickness of, for example, 2 $\mu$m; the active layer 16 having the MQW structure; the second p-type guide layer 17 made of GaN and having a thickness of, for example, 100 nm; the p-type cladding layer 18 made of AlGaN:Mg and having a thickness of, for example, 1 μm; the second p-type contact layer 19 made of GaN:Mg and having a thickness of, for example, 100 nm.

In this case, the semiconductor layers 14–18 are formed by, for example, usual MOCVD. The second contact layer 19 is however composed of the same composition as the semiconductor 4 and the contact layer 9 shown in FIGS. 1 and 2 and is formed by the same method for forming them.

Namely, at the time of growing the second contact layer 19 epitaxially, the ratio of V/III, the growing rate and the point defect density nD are set to 1000–5000, 4–10 μm/hour, and $1\times10^{19}$–$1\times10^{22}$ cm$^{-3}$, respectively.

In this case, a grooves is made to penetrate the contact layer 19, the cladding layers 18, the guide layer 17, the active layer 16, the guide layer 15 and the cladding layer 14 to leave a stripe portion, by which an electric current is supplied to the operation portion of the semiconductor layer, that is, the active layer. The groove is made outside the stripe portion, to expose a portion of the first contact layer 13 outside. A first electrode 11 is in ohmic contact therewith.

In this case, the first electrode 11 is formed by depositing (such as sputtering), for example, Ti, Pt and Au successively. A second electrode 12 is formed by depositing (such as sputtering), for example, Ni, Pt and Au successively.

An insulating layer 23 made of, for example, SiO2 is deposited on the second contact layer 19 by CVD or the like. A contact window 23W extending along the stripe direction is made in the insulating layer 23. The second electrode 12 is in ohmic contact onto the second contact layer 10 through the contact window 23W.

In the semiconductor laser according to this method and this structure, the carrier concentration of the p-type contact layer 19 can be made sufficiently high to reduce the resistance of the laser. Thus, it is possible to improve properties of the laser, for example, reduce its threshold voltage Vth and improve its emission efficiency.

The nitride semiconductor and the nitride semiconductor luminescence device according to the present invention are not limited to the above-mentioned embodiments. The present invention can be applied to nitride semiconductors having various structures. The semiconductor luminescence device is not limited to the laser having the SCH-MQW structure, such as the light emitting element described with reference to FIG. 2. The present invention can be applied to semiconductor lasers and light emitting diodes having various structures, such as a structure wherein an active layer has a monolayer quantum well structure or a DH (Double Hetero) structure.

In the nitride semiconductor and the nitride semiconductor luminescence device of the present invention, or according to the producing method of the present invention, the density of the carrier can be made high in the nitride semiconductor or the contact layer in the nitride semiconductor luminescence device to which the dopant Mg is added, thereby making the resistance thereof lower.

In the semiconductor luminescence device or the like, it is therefore possible to reduce its series resistance, improve light emitting properties and reduce driving electric power. As a result, the life span thereof can be made longer.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method for producing a p-type nitride semiconductor of BpAlqGarInsN ($0\leq p\leq 1, 0\leq q\leq 1, 0\leq r\leq 1, 0\leq s\leq 1$, p+q+r+s=1), wherein said p-type nitride semiconductor having a point defect concentration of $1\times10^{19}$ cm$^{-3}$ or more is grown.

2. A method for producing a nitride semiconductor luminescence device comprising p-type nitride semiconductor layers made of BpAlqGarInsN ($0\leq p\leq 1, 0\leq q\leq 1, 0\leq r\leq 1, 0\leq s\leq 1$, p+q+r+s=1), wherein at least one of said p-type nitride semiconductor layers is grown to be a p-type nitride semiconductor having a point defect concentration of $1\times10^{19}$ cm$^{-3}$ or more.

3. A method for producing a p-type nitride semiconductor of BpAlqGarInsN ($0\leq p\leq 1, 0\leq q\leq 1, 0\leq r\leq 1, 0\leq s\leq 1$, p+q+r+s=1), wherein the supplying ratio V/III of a V group raw material to a III group raw material is set to 1000–5000 to grow said p-type nitride semiconductor.

4. A method for producing a nitride semiconductor luminescence device comprising p-type nitride semiconductor layers made of BpAlqGarInsN ($0\leq p\leq 1, 0\leq q\leq 1, 0\leq r\leq 1, 0\leq s\leq 1$, p+q+r+s=1), wherein at least one of said p-type nitride semiconductor layers is grown in the manner that the supplying ratio V/III of a V group raw material to a III group raw material is set to 1000–5000.

5. A method for producing a p-type nitride semiconductor of BpAlqGarInsN ($0\leq p\leq 1, 0\leq q\leq 1, 0\leq r\leq 1, 0\leq s\leq 1$, p+q+r+s=1), wherein said p-type nitride semiconductor is grown at a growing rate of 4 μm/hour or more.

6. A method for producing a nitride semiconductor luminescence device comprising p-type nitride semiconductor layers made of BpAlqGarInsN ($0\leq p\leq 1, 0\leq q\leq 1, 0\leq r\leq 1, 0\leq s\leq 1$, p+q+r+s=1), wherein at least one of said p-type nitride semiconductors is grown at a growing rate of 4 μm/hour or more.

7. The method for producing a nitride semiconductor according to claim 3, wherein upon the growth of said p-type nitride semiconductor the supplying ratio V/III of a V group raw material to a III group raw material is set to 1000–5000 and the growing rate thereof is 4 μm/hour or more.

8. The method for producing a nitride semiconductor luminescence device according to claim 4, wherein upon the growth of at least one of the p-type nitride semiconductor layers the supplying ratio V/III of a V group raw material to a III group raw material is set to 1000–5000 and the growing rate thereof is set to 4 μm/hour or more.

9. The method for producing a nitride semiconductor according to claim 3, wherein upon the growth of said p-type nitride semiconductor the supplying ratio V/III of a V group raw material to a III group raw material is set to 1000–5000 and the growing rate thereof is set to 4 μm/hour or more, thereby growing said p-type nitride semiconductor having a point defect concentration of $1\times10^{19}$ cm$^{-3}$ or more.

10. The method for producing a nitride semiconductor luminescence device according to claim 4, wherein upon the growth of at least one of said p-type nitride semiconductor layers the supplying ratio V/III of a V group raw material to a III group raw material is set to 1000–5000 and the growing rate thereof is set to 4 μm/hour or more, thereby growing the layer to be a p-type nitride semiconductor having a point defect concentration of $1\times10^{19}$ cm$^{-3}$ or more.

11. The method for producing a nitride semiconductor according to claim 1, wherein after the growth of said p-type semiconductor the grown semiconductor is subjected to an activating treatment by heating or radiating an electron beam.

12. The method for producing a nitride semiconductor according to claim 2, wherein after the growth of said p-type semiconductor the grown semiconductor is subjected to an activating treatment by heating or radiating an electron beam.

13. The method for producing a nitride semiconductor according to claim 3, wherein after the growth of said p-type semiconductor the grown semiconductor is subjected to an activating treatment by heating or radiating an electron beam.

14. The method for producing a nitride semiconductor according to claim 4, wherein after the growth of said p-type semiconductor the grown semiconductor is subjected to an activating treatment by heating or radiating an electron beam.

15. The method for producing a nitride semiconductor according to claim 5, wherein after the growth of said p-type semiconductor the grown semiconductor is subjected to an activating treatment by heating or radiating an electron beam.

16. The method for producing a nitride semiconductor according to claim 6, wherein after the growth of said p-type semiconductor the grown semiconductor is subjected to an activating treatment by heating or radiating an electron beam.

17. The method for producing a nitride semiconductor according to claim 7, wherein after the growth of said p-type semiconductor the grown semiconductor is subjected to an activating treatment by heating or radiating an electron beam.

18. The method for producing a nitride semiconductor according to claim 8, wherein after the growth of said p-type semiconductor the grown semiconductor is subjected to an activating treatment by heating or radiating an electron beam.

19. The method for producing a nitride semiconductor according to claim 9, wherein after the growth of said p-type semiconductor the grown semiconductor is subjected to an activating treatment by heating or radiating an electron beam.

20. The method for producing a nitride semiconductor according to claim 10, wherein after the growth of said p-type semiconductor the grown semiconductor is subjected to an activating treatment by heating or radiating an electron beam.

21. The method for producing a nitride semiconductor luminescence device according to claim 4, wherein a contact layer of said nitride semiconductor luminescence device, is grown by said p-type nitride semiconductor layer, the supplying ratio V/III of a V group raw material to a III group raw material is set to more than 5000 upon the growth of an active layer constituting the nitride semiconductor luminescence device, or said active layer and a semiconductor layer adjacent thereto, and the relative ratio of the supplying ratio V/III upon the growth of said contact layer to the supplying ratio V/III upon the growth of said active layer, or said active layer and a semiconductor layer adjacent thereto is set to 0.5:1.

* * * * *